(12) United States Patent
Kim

(10) Patent No.: US 11,616,216 B2
(45) Date of Patent: *Mar. 28, 2023

(54) DISPLAY DEVICE

(71) Applicant: SAMSUNG DISPLAY CO., LTD., Yongin-si (KR)

(72) Inventor: Hyeonggwaon Kim, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/459,625

(22) Filed: Aug. 27, 2021

(65) Prior Publication Data

US 2021/0391559 A1 Dec. 16, 2021

Related U.S. Application Data

(63) Continuation of application No. 16/987,576, filed on Aug. 7, 2020, now Pat. No. 11,108,025.

(30) Foreign Application Priority Data

Oct. 31, 2019 (KR) .................. 10-2019-0137411

(51) Int. Cl.
*G09G 5/00* (2006.01)
*H01L 51/52* (2006.01)
(Continued)

(52) U.S. Cl.
CPC ....... *H01L 51/5275* (2013.01); *G09G 3/3225* (2013.01); *H01L 27/3246* (2013.01);
(Continued)

(58) Field of Classification Search
CPC .... G06F 1/1626; G06F 1/1684; G06F 1/3215; G06F 3/0412; G06F 3/0421; G06F 3/043; G06F 3/044; G06K 9/0002; G06K 9/0004
See application file for complete search history.

(56) References Cited

U.S. PATENT DOCUMENTS 8,896,800 B2    11/2014  Park et al.
2011/0211151 A1*  9/2011  Jeong ............... G02F 1/1345
                                                    349/153
(Continued)

FOREIGN PATENT DOCUMENTS

CN      107946321       4/2018
KR    10-2018-0083700   7/2018
KR     10-1998096       7/2019

*Primary Examiner* — Insa Sadio
(74) *Attorney, Agent, or Firm* — F. Chau & Associates, LLC

(57) ABSTRACT

A display device includes a display panel, and an electronic module disposed thereunder. The display panel includes a first display area having first areas with a first pixel density and a pixel-free area, each first area including a respective pixel, the pixel-free area including second areas and third areas, each third area surrounding a respective second area and disposed between the respective second area and at least one first area, a second display area having a second pixel density greater than the first pixel density, first pattern layers disposed in the third areas, respectively, each first pattern layer surrounding a respective second area in a plan view, and second pattern layers disposed on the first pattern layers, respectively.

16 Claims, 14 Drawing Sheets

(51) Int. Cl.
  *H01L 27/32* (2006.01)
  *G09G 3/3225* (2016.01)
(52) U.S. Cl.
  CPC . *H01L 27/3258* (2013.01); *G09G 2320/0233* (2013.01); *G09G 2320/0626* (2013.01); *G09G 2360/16* (2013.01)

(56) References Cited

U.S. PATENT DOCUMENTS

2012/0206669 A1* 8/2012 Kim .................. G02F 1/133308
　　　　　　　　　　　　　　　　　　　　　349/153
2018/0204040 A1　　7/2018　Kwon et al.
2021/0135165 A1　　5/2021　Kim

* cited by examiner

DISPLAY DEVICE

CROSS-REFERENCE TO RELATED APPLICATION

This U.S. non-provisional patent application is a continuation of U.S. application Ser. No. 16/987,576 filed on Aug. 7, 2020 which claims priority under 35 U.S.C. § 119 of Korean Patent Application No. 10-2019-0137411, filed on Oct. 31, 2019, the contents of which are hereby incorporated by reference in its entirety.

BACKGROUND

1. Field of Disclosure

The present invention relates to a display device, more particularly to a display device with display areas with different pixel densities.

2. Description of the Related Art

Various display devices applied to a multimedia device, such as a television, a mobile phone, a navigation unit, a computer monitor, or a game unit, are being developed. The display devices include a display panel and an electronic module to provide an image with certain information with a user. The electronic module is disposed under the display panel to receive an external signal or to provide an output signal to the outside.

SUMMARY

The present invention provides a display device having improved reliability.

According to an embodiment of the present invention, a display device includes a display panel, and an electronic module disposed under the display panel. The display panel includes a first display area having a plurality of first areas with a first pixel density and a pixel-free area, each of the plurality of first areas including a respective pixel of a plurality of pixels, the pixel-free area including a plurality of second areas and a plurality of third areas, each of the plurality of third areas surrounding a respective second area of the plurality of second areas and disposed between the respective second area and at least one first area, directly adjacent thereto, of the plurality of first areas, a second display area having a second pixel density greater than the first pixel density, a plurality of first pattern layers disposed in the plurality of third areas, respectively, each of the first pattern layers surrounding a respective second area of the plurality of second areas in a plan view, and a plurality of second pattern layers disposed on the plurality of first pattern layers, respectively.

The first display area has a transmittance greater than a transmittance of the second display area. A transmittance of each of the plurality of second areas is greater than a transmittance of each of the plurality of first areas. The display panel further includes a circuit layer disposed in the plurality of first areas, the plurality of second areas, and the plurality of third areas. The plurality of first pattern layers and the plurality of second pattern layers are disposed on the circuit layer.

Each of the plurality of second areas is provided with a transmission opening defined therein by removing a portion of the circuit layer.

Each of the plurality of pixels comprises a first electrode, a light emitting layer, and a second electrode. The first electrode is disposed on the circuit layer.

Each of the plurality of second pattern layers controls a traveling direction of an outgoing light emitted from the light emitting layer.

Each of the plurality of first pattern layers blocks an incoming light from an outside of the display panel.

The electronic module overlaps the plurality of first areas, the plurality of second areas, and the plurality of third areas in the plan view.

The display device of claim 1 further includes a first controller electrically connected to the display panel. The first controller controls a first pixel, adjacent to a corresponding one of the plurality of third areas, among the plurality of pixels in accordance with an operation state of the electronic module.

The first controller includes a brightness difference calculator circuit configured to compare a first brightness of the first display area with a second brightness of the second display area to calculate a brightness difference, a storage configured to receive information about a brightness reduction amount from the brightness difference calculator circuit and store the information about the brightness reduction amount, a correction amount determiner circuit configured to determine a correction amount based on the brightness reduction amount from the storage, a corrector circuit configured to receive information about the correction amount from the correction amount determiner circuit to control the second brightness, and a state determiner circuit configured to determine the operation state of the electronic module to provide a first signal to the corrector circuit.

The corrector circuit, in response to the first signal indicating that the electronic module operates, outputs a second signal to turn off the first pixel.

The corrector circuit, in response to the first signal indicating that the electronic module does not operate, outputs a third signal to turn on the first pixel.

The electronic module is disposed under the first display area.

The display device further includes a second controller configured to provide a signal to drive the display panel. The first controller is electrically connected to the first display area. The second controller is electrically connected to the second display area.

Each of the plurality of second pattern layers surrounds a respective second area of the plurality of second areas in the plan view.

The plurality of first areas are spaced apart from each other with each of the plurality of second areas interposed between a respective pair of first areas adjacent to each other of the plurality of first areas.

A number of the plurality of first areas is smaller than a number of the plurality of second areas.

Each of the plurality of first areas and each of the plurality of second areas are alternately arranged in a first direction. At least N of the plurality of first areas and at least N of the plurality of second areas are alternately arranged in a second direction different from the first direction. N is an integer number equal to or greater than one.

A number of the plurality of first areas is equal to a number of the plurality of second areas.

The electronic module includes a camera.

A width of each of the plurality of first pattern layers is greater than a width of a respective one of the plurality of second pattern layers. According to an exemplary embodiment, the first pattern layer blocks the light incident into the third area from the outside and prevents the image from being distorted. The electronic module photographs the light incident into the second area from the outside and forms the image. The first pattern layer improves the quality of the image. The second pattern layer controls the traveling direction of the light provided from the adjacent pixel, and thus, the light travels to the outside. The light provided from the third area compensates for the insufficient brightness in the first display area. Accordingly, the visibility of the display device is improved, and thus, the display device having improved reliability is provided.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION

Figure 1:
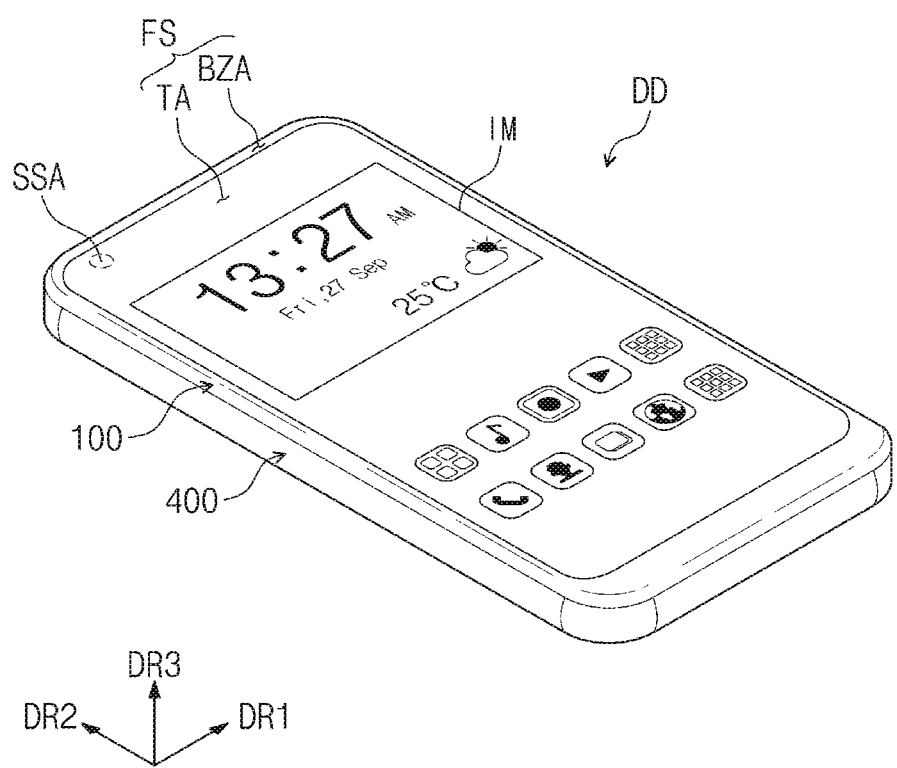
FIG. 1 is a perspective view showing a display device according to an embodiment of the present invention.

In the present disclosure, it will be understood that when an element or layer is referred to as being "on", "connected to" or "coupled to" another element or layer, it can be directly on, connected or coupled to the other element or layer, or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be explained in detail with reference to the accompanying drawings.

Figure 2:
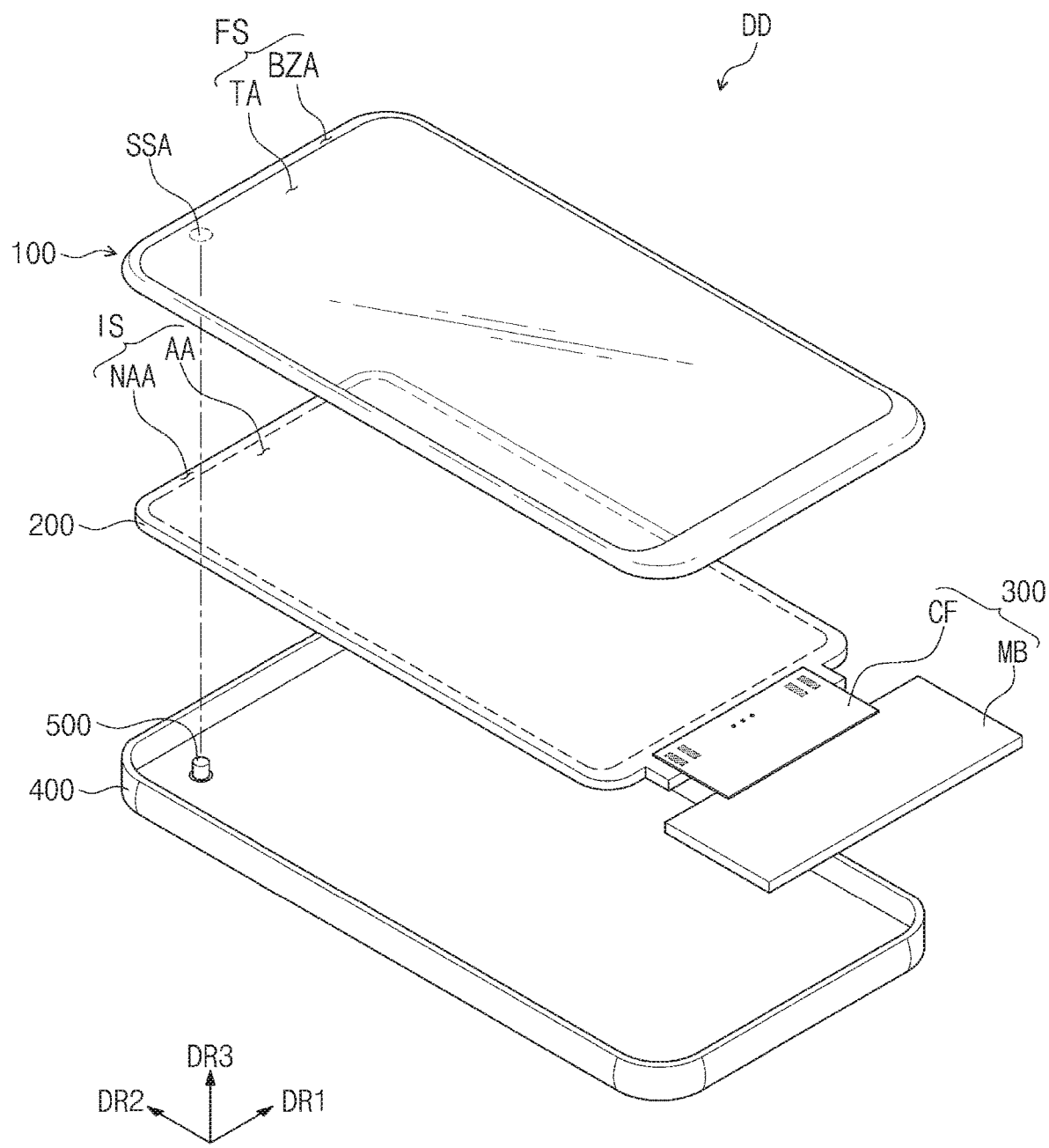
FIG. 2 is an exploded perspective view showing a display device according to an embodiment of the present invention.

FIG. 1 is a perspective view showing a display device DD according to an embodiment of the present invention, and FIG. 2 is an exploded perspective view showing the display device DD according to an embodiment of the present invention.

Referring to FIGS. 1 and 2, the display device DD may be a device activated in response to an electrical signal. The display device DD may include various embodiments. For example, the display device DD may be applied to a large-sized electronic item, such as a television set, a monitor, or an outdoor billboard, and a small and medium-sized electronic item, such as a personal computer, a notebook computer, a personal digital assistants, a navigation unit, a game unit, a portable electronic device, and a camera. These are merely exemplary, and thus, the display device DD may be applied to other electronic devices as long as they do not depart from the concept of the present invention. In the present exemplary embodiment, a smartphone will be described as a representative example of the display device DD.

The display device DD displays an image IM through a display surface FS, which is substantially parallel to a plane defined by a first direction DR1 and a second direction DR2. A third direction DR3 may be substantially perpendicular to the display surface FS. The display surface FS through which the image IM is displayed corresponds to a front surface of the display device DD and a front surface of a window 100. Hereinafter, the display surface and the front surface of the display device DD and the front surface of the window 100 are assigned with the same reference numeral. The image IM includes a still image as well as a motion image. FIG. 1 shows a clock widget and application icons as a representative example of the image IM.

In the present exemplary embodiment, front (or upper) and rear (or lower) surfaces of each member of the display device DD are defined with respect to a direction in which the image IM is displayed. The front and rear surfaces face each other in the third direction DR3, and a normal line direction of each of the front and rear surfaces is substantially parallel to the third direction DR3. The third direction DR3 crosses the first direction DR1 and the second direction DR2, and the first direction DR1, the second direction DR2, and the third direction DR3 are perpendicular to each other. In the following descriptions, a surface defined by the first direction DR1 and the second direction DR2 is defined as a plane surface, and the expression "when viewed in a plan view" may refer to being viewed in the third direction DR3.

The display device DD includes the window 100, a display module 200, a driving circuit unit 300, a housing 400, and an electronic module 500. In the present exemplary embodiment, the window 100 and the housing 400 are coupled to each other to provide an appearance of the display device DD.

The window 100 includes an optically transparent insulating material. For example, the window 100 includes a glass or plastic material. The window 100 has a single-layer or multi-layer structure. As an example, the window 100 includes a plurality of plastic films attached to each other by an adhesive or a glass substrate and a plastic film attached to the glass substrate by an adhesive.

The window 100 is divided into a transmissive area TA and a bezel area BZA in a plan view. The transmissive area TA is an optically transparent area. The bezel area BZA is an area having a relatively lower transmittance as compared with the transmissive area TA. The bezel area BZA defines a shape of the transmissive area TA. The bezel area BZA is disposed adjacent to the transmissive area TA and surrounds the transmissive area TA.

The bezel area BZA has a predetermined color. The bezel area BZA covers a peripheral area NAA of the display module 200 to prevent the peripheral area NAA from being viewed from the outside. However, this is merely exemplary, and the bezel area BZA may be omitted from the window 100 according to an embodiment of the present invention.

In an embodiment of the present invention, the window 100 includes a sensing area SSA in the transmissive area TA. The sensing area SSA may overlap the electronic module 500. The display device DD may receive an external signal for the electronic module 500 through the sensing area SSA or may provide an output signal output from the electronic module 500 to the outside through the sensing area SSA. According to the present invention, the sensing area SSA may be disposed to overlap the transmissive area TA. Accordingly, a separate area provided for the sensing area SSA may be omitted in an area other than the transmissive area TA. Therefore, a size of the bezel area BZA may be reduced. In an exemplary embodiment, the external signal may include light or sound, and the output signal may light or sound.

FIGS. 1 and 2 show one sensing area SSA. The present invention, however, is not limited thereto. In an exemplary embodiment, two or more sensing areas SSA may be defined in the transmissive area TA. In addition, the sensing area SSA is defined at a left upper end portion of the transmissive area TA in FIGS. 1 and 2. The present invention, however, is not limited thereto. In an exemplary embodiment, the sensing area SSA may be defined in various positions in the transmissive area TA such as a right upper end portion of the transmissive area TA, a left lower end portion of the transmissive area TA, or a right lower end portion of the transmissive area TA.

The display module 200 is disposed under the window 100. The display module 200 displays the image IM. The display module 200 includes a front surface IS in which an active area AA and the peripheral area NAA are defined. The active area AA is an area activated in response to an electrical signal. In an exemplary embodiment, pixels may be positioned in the active area AA, and the peripheral area NAA may be a pixel-free area.

In the present exemplary embodiment, the active area AA is an area through which the image IM is displayed. The transmissive area TA overlaps the active area AA. For example, the transmissive area TA overlaps an entire surface or at least a portion of the active area AA. Accordingly, a user perceives the image IM through the transmissive area TA.

The peripheral area NAA is covered by the bezel area BZA. The peripheral area NAA is disposed adjacent to the active area AA. The peripheral area NAA surrounds the active area AA. A driving circuit or a driving line is disposed in the peripheral area NAA to drive the active area AA.

In an present exemplary embodiment, the display module 200 is assembled in a flat state such that the active area AA and the peripheral area NAA of the display module 200 face the window 100. However, this is merely exemplary, and a portion of the peripheral area NAA may be curved. In this case, the portion of the peripheral area NAA is bent toward a rear surface of the display device DD, and thus, the size of the bezel area BZA is reduced in a front side of the display device DD. In an exemplary embodiment, the display module 200 may be assembled such that a portion of the active area AA is bent. In an exemplary embodiment, the peripheral area NAA may be omitted from the display module 200.

The driving circuit unit 300 is electrically connected to the display module 200. The driving circuit unit 300 includes a main circuit board MB and a flexible film CF.

The flexible film CF is electrically connected to the display module 200. The flexible film CF is connected to pads of the display module 200, which are arranged in the peripheral area NAA. The flexible film CF provides electrical signals to the display module 200 to drive the display module 200. The electrical signals are generated by the flexible film CF or by the main circuit board MB. The main circuit board MB includes various driving circuits to drive the display module 200 or a connector to supply a power.

In an exemplary embodiment, an area of the display module 200, which overlaps the sensing area SSA, has a relatively higher transmittance compared with the active area AA that does not overlap the sensing area SSA. For example, at least some components of the display module 200 may be removed from the area of the display module 200 that overlaps the sensing area SSA. Thus, the electronic module 500 may easily transmit and/or receive signals through the sensing area SSA. In an exemplary embodiment, the signals may include sound or light.

The electronic module 500 is disposed under the display module 200. The electronic module 500 overlaps the sensing area SSA in a plan view. The electronic module 500 receives the external input provided through the sensing area SSA or provides the output through the sensing area SSA. The electronic module 500 includes a camera, an infrared sensor, or a proximity sensor.

The housing 400 is coupled to the window 100. The housing 400 is coupled to the window 100 to provide an inner space therein. The display module 200 and the electronic module 500 are accommodated in the inner space.

The housing 400 has a material with a relatively high rigidity. For example, the housing 400 includes a glass, plastic, or metal material or a plurality of frames and/or plates of combinations thereof. The housing 400 stably protects the components of the display device DD accommodated in the inner space from external impacts.

Figure 3:
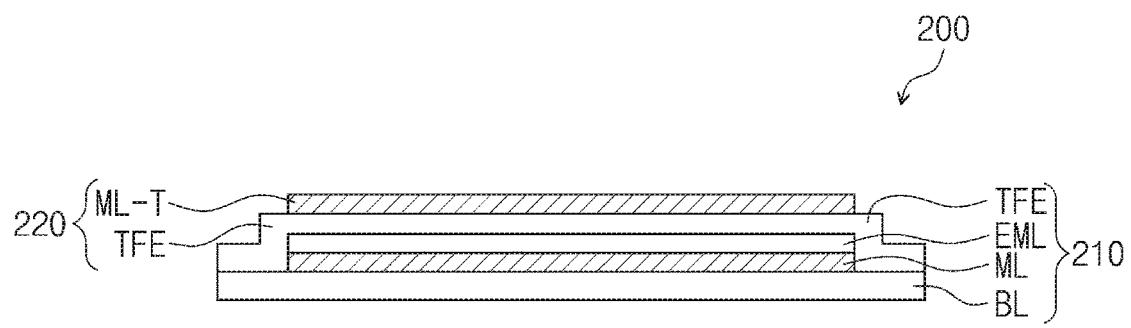
FIG. 3 is a cross-sectional view showing a display module according to an embodiment of the present invention.
Figure 3:
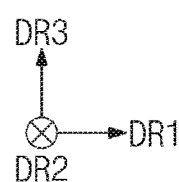

FIG. 3 is a cross-sectional view showing the display module 200 according to an embodiment of the present invention.

Referring to FIG. 3, the display module 200 includes a display panel 210 and an input sensing unit 220. The display panel 210 includes a first base layer BL, a circuit layer ML, a display element layer EML, and a thin film encapsulation layer TFE. The input sensing unit 220 includes a second base layer TFE and a sensing circuit layer ML-T. The thin film encapsulation layer TFE and the second base layer TFE may be the same layer. The reference "TFE" may be interchangeably used to refer to the second base layer and the thin film encapsulation layer.

According to an embodiment of the present invention, the display panel 210 and the input sensing unit 220 are formed through successive processes. For example, the sensing circuit layer ML-T is formed directly on the thin film encapsulation layer TFE (or the second base layer).

The first base layer BL is a silicon substrate, a plastic substrate, a glass substrate, an insulating film, or a stack structure including a plurality of insulating layers.

The circuit layer ML is disposed on the first base layer BL. The circuit layer ML includes a plurality of insulating layers, a plurality of conductive layers, and a semiconductor layer. The conductive layers of the circuit layer ML form signal lines or a pixel control circuit.

The display element layer EML is disposed on the circuit layer ML. The display element layer EML includes a light emitting layer that emits the light. For example, a light emitting layer of an organic light emitting display panel includes an organic light emitting material. In an exemplary embodiment, a light emitting layer of a quantum dot light emitting display panel includes at least one of a quantum dot and a quantum rod.

The sensing circuit layer ML-T is disposed on the second base layer TFE. The sensing circuit layer ML-T includes a plurality of insulating layers and a plurality of conductive layers. The conductive layers form a sensing electrode that senses the external input such a user touch, a sensing line that is connected to the sensing electrode, and a sensing pad that is connected to the sensing line.

Figure 4:
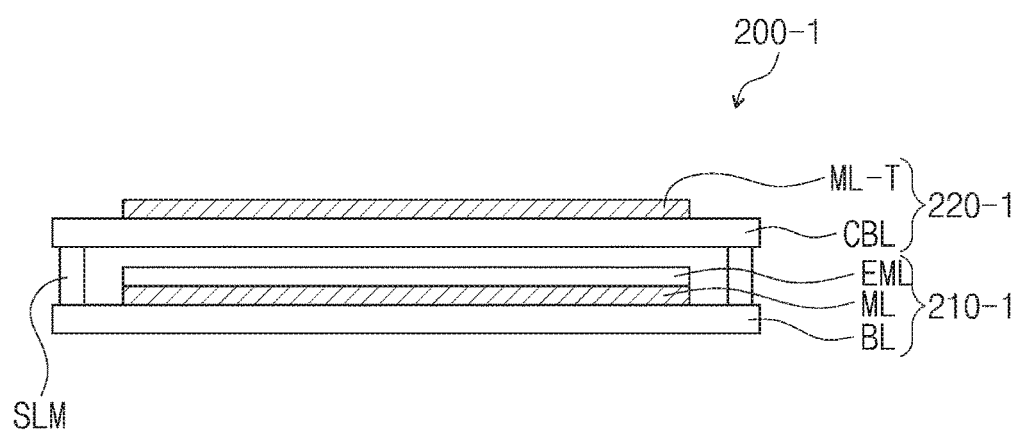
FIG. 4 is a cross-sectional view showing a display module according to an embodiment of the present invention.
Figure 4:
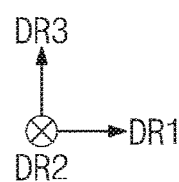

FIG. 4 is a cross-sectional view showing a display module 200-1 according to an embodiment of the present invention. In FIG. 4, the same reference numerals denote the same elements in FIG. 3, and thus, detailed descriptions of the same elements will be omitted.

Referring to FIG. 4, the display module 200-1 includes a display panel 210-1 and an input sensing unit 220-1. The display panel 210-1 includes a first base layer BL, a circuit layer ML, and a display element layer EML. The input sensing unit 220-1 includes a cover substrate CBL and a sensing circuit layer ML-T.

The cover substrate CBL is disposed on the display element layer EML. The cover substrate CBL is a silicon substrate, a plastic substrate, a glass substrate, an insulating film, or a stack structure including a plurality of insulating layers. A predetermined space is defined between the cover substrate CBL and the display element layer EML. The space is filled with air or an inert gas. The present invention is not limited thereto. In an exemplary embodiment, the space may be filled with a filler such as a silicone-based polymer, an epoxy-based resin, or an acrylic-based resin.

A coupling member SLM is disposed between the first base layer BL and the cover substrate CBL. The coupling member SLM combines the first base layer BL and the cover substrate CBL. The coupling member SLM includes an organic material, such as a photo-curable resin or a photo-plastic resin, or includes an inorganic material, such as a frit seal. However, the present invention is not limited there.

Figure 5:
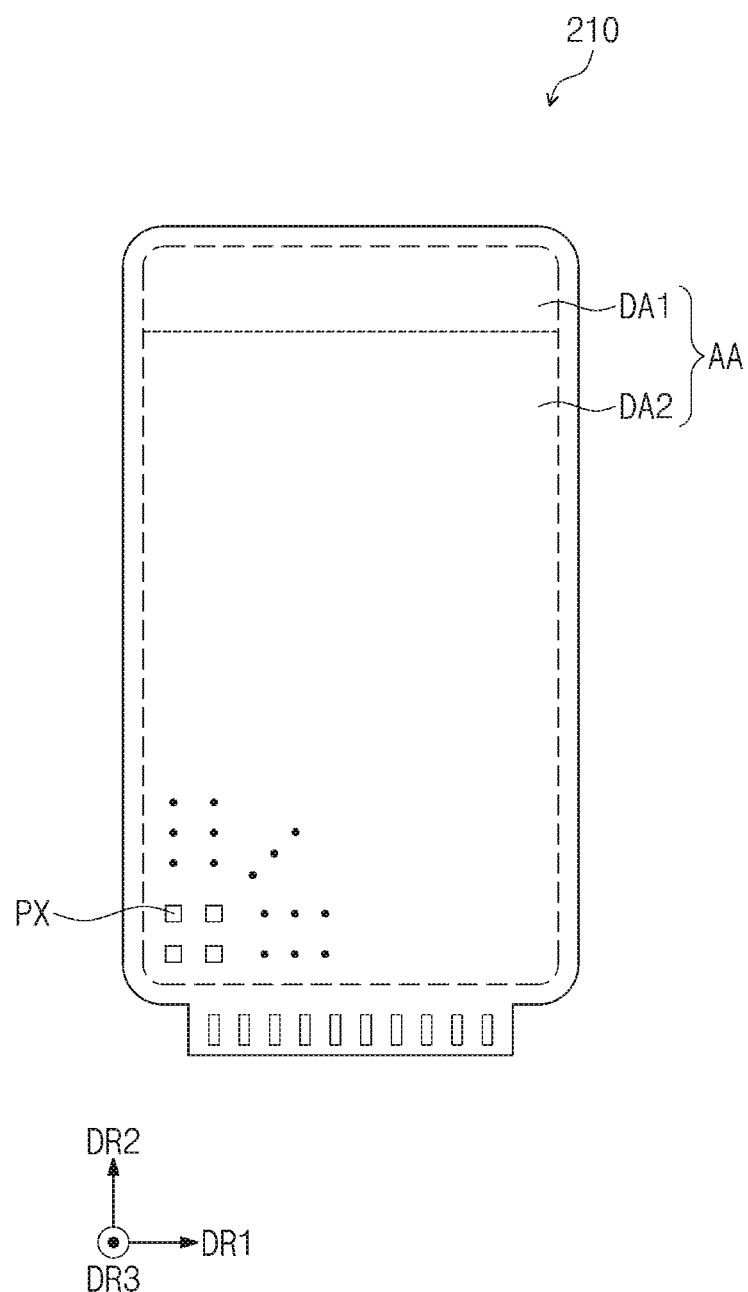
FIG. 5 is a plan view showing a display panel according to an embodiment of the present invention.

FIG. 5 is a plan view showing the display panel 210 according to an embodiment of the present invention.

Referring to FIG. 5, an active area AA of the display panel 210 corresponds to the active area AA (refer to FIG. 2) of the display module 200 (refer to FIG. 2).

A plurality of pixels PX are arranged in the active area AA. The plurality of pixels PX are arranged in the first direction DR1 and the second direction DR2. Each of the plurality of pixels PX displays one or a mixed color of primary colors. The primary colors include red, green, and blue colors. The mixed color includes various colors, e.g., white, yellow, cyan, or magenta. However, the colors displayed by the plurality of pixels PX should not be limited thereto or thereby.

A first display area DA1 and a second display area DA2 are defined in the active area AA.

The electronic module 500 (refer to FIG. 2) is disposed under the first display area DA1. The first display area DA1 has a transmittance higher than a transmittance of the second display area DA2. Accordingly, signals are easily transmitted to and/or received from the electronic module 500 (refer to FIG. 2) through the first display area DA1 compared to the second display area DA2. Some components are omitted from the first display area DA1 to increase the transmittance. For example, some pixels of the pixels arranged in the first display area DA1 are removed. In an exemplary embodiment, the first display area DA1 may have a first pixel density and the second display area DA2 may have a second pixel density greater than the first pixel density.

The first display area DA1 overlaps the sensing area SSA (refer to FIG. 2) in a plan view. The first display area DA1 has a size greater than a size of the sensing area SSA (refer to FIG. 2).

The first display area DA1 and the second display area DA2 are disposed adjacent to each other in the second direction DR2. A boundary between the first display area DA1 and the second display area DA2 extends in the first direction DR1. The first display area DA1 is defined on the display panel 210 in a plan view.

Figure 6:
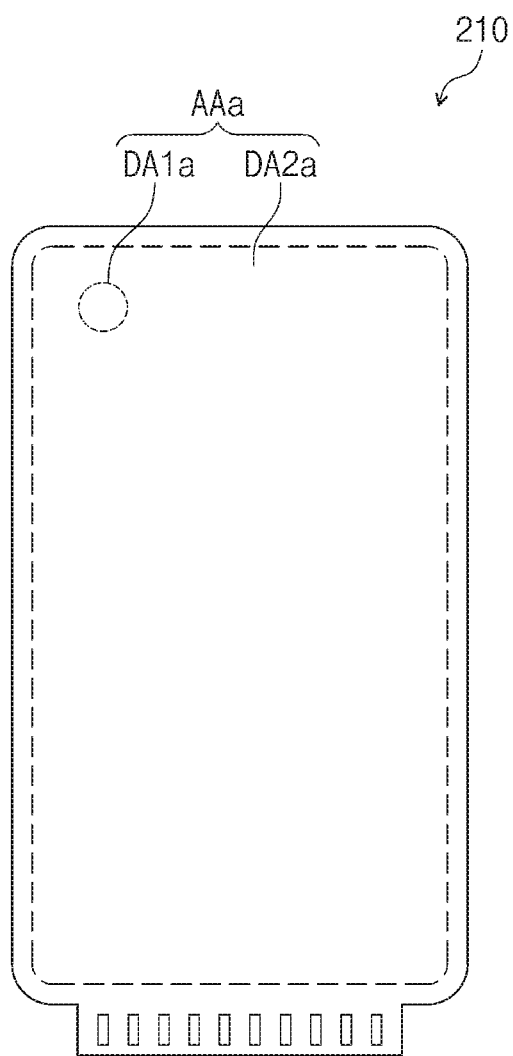
FIG. 6 is a plan view showing a display panel according to an embodiment of the present invention.

FIG. 6 is a plan view showing a display panel 210 according to an embodiment of the present invention. In FIG. 6, the same reference numerals denote the same elements in FIG. 5, and thus, detailed descriptions of the same elements will be omitted.

Referring to FIG. 6, a first display area DA1a and a second display area DA2a are defined in an active area AAa. In an embodiment of the present invention, the first display area DA1a overlaps the sensing area SSA (refer to FIG. 2). The first display area DA1a is surrounded by the second display area DA2a.

Figure 7:
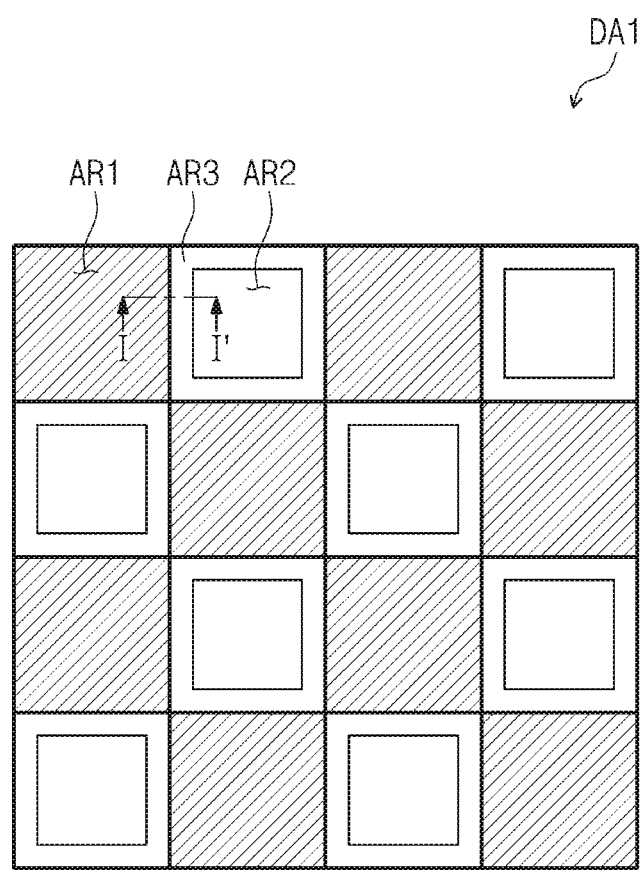
FIG. 7 is an enlarged plan view showing a portion of a first display area according to an embodiment of the present invention.

FIG. 7 is an enlarged plan view showing a portion of the first display area DA1 according to an embodiment of the present invention.

Referring to FIG. 7, the first display area DA1 includes a plurality of first areas AR1, a plurality of second areas AR2, and a plurality of third areas AR3.

The plurality of first areas AR1 are areas in which the plurality of pixels PX (refer to FIG. 5) are respectively arranged. Each of the plurality of first areas AR1 is spaced apart from other plurality of first areas AR1 with the plurality of second areas AR2 interposed therebetween. For example, the plurality of first areas AR1 and the plurality of second areas AR2 are alternately arranged in the first direction DR1 and in the second direction DR2. Therefore, one first area AR1 is adjacent to at least one second area AR2.

The plurality of second areas AR2 are areas in which the plurality of pixels PX (refer to FIG. 5) are not disposed. Each of the plurality of second areas AR2 has a transmittance higher than a transmittance of each of the first areas AR1. Some components of the display panel 210 (refer to FIG. 5) are omitted from each of the plurality of second areas AR2.

The number of the plurality of first areas AR1 may be the same as the number of the plurality of second areas AR2.

In FIG. 7, the plurality of second areas AR2 and the plurality of third areas AR3 have substantially the same size as the plurality of first areas AR1, however, the first areas AR1, the plurality of second areas AR2, and the plurality of third areas AR3 according to the embodiment of the present invention should not be limited thereto or thereby. The transmittance of the first display area DA1 required according to the type of the display panel 210 (refer to FIG. 5) is varied, and thus, a ratio per unit area of the first areas AR1, the plurality of second areas AR2 and the plurality of third areas AR3 is determined depending on the transmittance of the first display area DA1.

Each of the plurality of third areas AR3 is defined between each of the plurality of first areas AR1 and each of the plurality of second areas AR2. Each of the plurality of third areas AR3 surrounds a corresponding second area AR2 among the plurality of second areas AR2.

Figure 8:
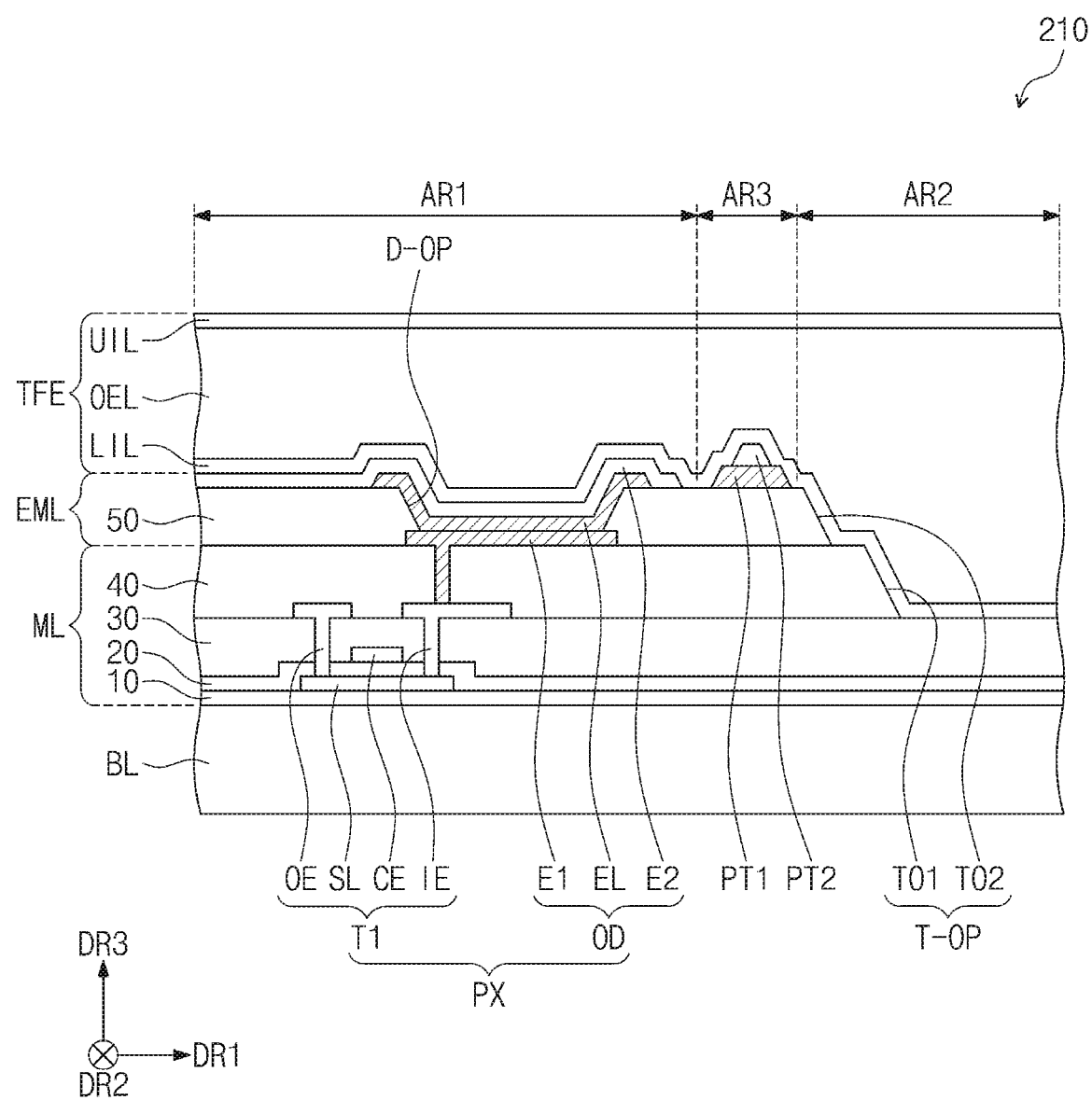
FIG. 8 is a cross-sectional view taken along a line I-I' shown in FIG. 7 according to an embodiment of the present invention.

FIG. 8 is a cross-sectional view taken along a line I-I' shown in FIG. 7 according to an embodiment of the present invention.

FIG. 8 shows the cross-section of one first area AR1, one second area AR2, and one third area AR3 disposed between the first area AR1 and the second area AR2.

The display panel 210 includes the first base layer BL, the circuit layer ML, the display element layer EML, and the thin film encapsulation layer TFE. The circuit layer ML provides a signal to drive a light emitting element OD included in the display element layer EML. The pixel PX includes a transistor T1 and the light emitting element OD.

The circuit layer ML includes the first transistor T1, a first insulating layer 10, a second insulating layer 20, a third insulating layer 30, and a fourth insulating layer 40. The first insulating layer 10 is disposed on the first base layer BL to cover the entire surface of the first base layer BL. The first insulating layer 10 includes an inorganic material. The first insulating layer 10 includes a barrier layer and/or a buffer layer. Accordingly, the first insulating layer 10 prevents oxygen or moisture introduced through the first base layer BL from entering the pixel PX.

The transistor T1 is disposed on the first insulating layer 10. The transistor T1 includes a semiconductor pattern SL, a control electrode CE, a first electrode OE, and a second electrode IE. The semiconductor pattern SL includes a semiconductor material. The control electrode CE is spaced apart from the semiconductor pattern SL with the second insulating layer 20 interposed therebetween.

The first electrode OE and the second electrode IE extend through the second insulating layer 20 and the third insulating layer 30 to be respectively connected to one side and the other side of the semiconductor pattern SL. However, the present invention is not limited thereto. In an exemplary embodiment, the first electrode OE and the second electrode IE may be disposed on the same layer as the semiconductor pattern SL and have an integral shape with the semiconductor pattern SL. For example, the first electrode OE extends from one end of the semiconductor pattern SL, and the second electrode IE extends from the other end of the semiconductor pattern SL. A channel area may be an area between the second electrode IE and the first electrode OE. The transistor T1 according to an embodiment of the present invention may have various stacked structures, however, it should not be limited thereto or thereby.

The fourth insulating layer 40 is disposed on the third insulating layer 30 to cover the first electrode OE and the second electrode IE. The fourth insulating layer 40 includes an organic material and/or an inorganic material and has a single-layer or multi-layer structure.

The display element layer EML includes the light emitting element OD and a fifth insulating layer 50. The light emitting element OD includes a first electrode E1, a light emitting pattern EL, and a second electrode E2. The first electrode E1 is disposed on the fourth insulating layer 40. The first electrode E1 extends through the fourth insulating layer 40 to be electrically connected to the transistor T1. In FIG. 8, the first electrode E1 is connected directly to the transistor T1. The present invention, however, is not limited thereto. In an exemplary embodiment, the first electrode E1 may be electrically connected to the transistor T1 via at least one other transistor.

The fifth insulating layer 50 is disposed on the fourth insulating layer 40. The fifth insulating layer 50 is provided with a display opening D-OP defined therethrough. At least a portion of the first electrode E1 is exposed through the display opening D-OP. The fifth insulating layer 50 may be referred to as a "pixel definition layer".

The light emitting pattern EL is disposed on the first electrode E1 exposed through the display opening D-OP. The light emitting pattern EL includes a light emitting material. For example, the light emitting pattern EL includes at least one material among materials emitting red, green, and blue lights. The light emitting pattern EL includes a fluorescent material or a phosphorescent material. The light emitting pattern EL includes an organic light emitting material or an inorganic light emitting material. The light emitting pattern EL emits the light in response to a difference in electric potential between the first electrode E1 and the second electrode E2.

The second electrode E2 is disposed on the light emitting pattern EL. The second electrode E2 includes a transparent conductive material or a semi-transparent conductive material. Accordingly, the light generated by the light emitting pattern EL easily travels to the third direction DR3 through the second electrode E2. The second electrode E2 may be commonly provided in the pixels.

However, this is merely exemplary. The light emitting element OD according to an embodiment of the present invention is operated in a rear surface light emitting manner in which the first electrode E1 includes the transparent or semi-transparent conductive material or a both surface light emitting manner in which the light is emitted to both of the front and rear surfaces. The present invention is not limited thereto.

In FIG. 8, the second electrode E2 is disposed in the first area AR1 without being disposed in the second area AR2 and the third area AR3, however, it should not be limited thereto or thereby. For example, the second electrode E2 may overlap the first area AR1, the second area AR2, and the third area AR3.

The thin film encapsulation layer TFE is disposed on the light emitting element OD to encapsulate the light emitting element OD. Although not shown in figures, a capping layer may further be disposed between the second electrode E2 and the thin film encapsulation layer TFE to cover the second electrode E2.

The thin film encapsulation layer TFE includes a first inorganic layer LIL, an organic layer OEL, and a second inorganic layer UIL, which are sequentially stacked in the third direction DR3, however, the thin film encapsulation layer TFE according to an embodiment of the present invention should not be limited thereto or thereby. The thin film encapsulation layer TFE may further include a plurality of inorganic layers and organic layers.

The first inorganic layer LIL covers the second electrode E2. The first inorganic layer LIL prevents external moisture or oxygen from entering the light emitting element OD. For example, the first inorganic layer LIL includes silicon nitride, silicon oxide, or a compound thereof.

The organic layer OEL is disposed on the first inorganic layer LIL to contact the first inorganic layer LIL. The organic layer OEL provides a flat surface on the first inorganic layer LIL. An uneven shape formed on the upper surface of the first inorganic layer LIL or particles existing on the first inorganic layer LIL are covered by the organic layer OEL, and thus, an influence of a surface state of the upper surface of the first inorganic layer LIL exerted on components formed on the organic layer OEL is blocked. In an exemplary embodiment, the organic layer OEL relieves a stress between layers contacting each other. The organic layer OEL includes an organic material.

The second inorganic layer UIL is disposed on the organic layer OEL to cover the organic layer OEL. The second inorganic layer UIL is stably formed on a relatively flat surface rather than being disposed on the first inorganic layer LIL. The second inorganic layer UIL prevents moisture leaked from the organic layer OEL from flowing to the outside. The second inorganic layer UIL includes silicon nitride, silicon oxide, or a compound thereof.

A transmission opening T-OP is defined in the second area AR2 by removing portions of the insulating layers included in the circuit layer ML and the display element layer EML. In an exemplary embodiment, the transmission opening T-OP in the second area AR2 extends through the insulating layers included in the circuit layer ML and the display element layer EML. For example, the insulating layers include the fourth insulating layer 40 and the fifth insulating layer 50.

The transmission opening T-OP includes a first transmission opening TO1 and a second transmission opening TO2. The first transmission opening TO1 and the second transmission opening TO2 are formed to be aligned in the third direction DR3. In an exemplary embodiment, the first transmission opening TO1 and the second transmission opening TO2 overlap each other and are connected to each other.

The first transmission opening TO1 is defined through the fourth insulating layer 40, and the second transmission opening TO2 is defined through the fifth insulating layer 50.

The transmission opening T-OP is covered by the first inorganic layer LIL of the thin film encapsulation layer TFE. For example, the first inorganic layer LIL covers an inner sidewall of the transmission opening T-OP (e.g., an inner sidewall of the first transmission opening TO1 and an inner sidewall of the second transmission opening TO2). The first inorganic layer LIL further covers an upper surface of the third insulating layer 30 exposed by the transmission opening T-OP.

Since the pixel PX is not disposed in the second area AR2, the second area AR2 has a relatively higher light transmittance than the first area AR1.

The third area AR3 is defined between the first area AR1 and the second area AR2. A first pattern layer PT1 and a second pattern layer PT2 are disposed in the third area AR3. In an exemplary embodiment, a width, measured in the first direction DR1, of the first pattern layer PT1 is greater than a width, measured in the first direction DR1, of the second pattern layer PT2.

The first pattern layer PT1 is disposed on the fifth insulating layer 50. The first pattern layer PT1 surrounds the second area AR2 in a plan view. The first pattern layer PT1 blocks an incoming light toward the display panel 210. For example, the first pattern layer PT1 includes a light blocking layer which prevents the incoming light from entering the electronic module 500 of FIG. 2.

The second pattern layer PT2 is disposed on the first pattern layer PT1. The second pattern layer PT2 surrounds the second area AR2 in a plan view. The second pattern layer PT2 controls a path of an outgoing light from the first area AR1 to increase brightness of the outgoing light of the first area AR1. For example, the second pattern layer PT2 may serve as a light guiding layer to increase brightness of the first area AR1, for example. In FIG. 7, the second pattern layer PT2 disposed in the third area AR3 may increase brightness of each of four first areas AR1 directly adjacent to the third area AR3, for example.

The first inorganic layer LIL covers the first pattern layer PT1 and the second pattern layer PT2.

Figure 9:
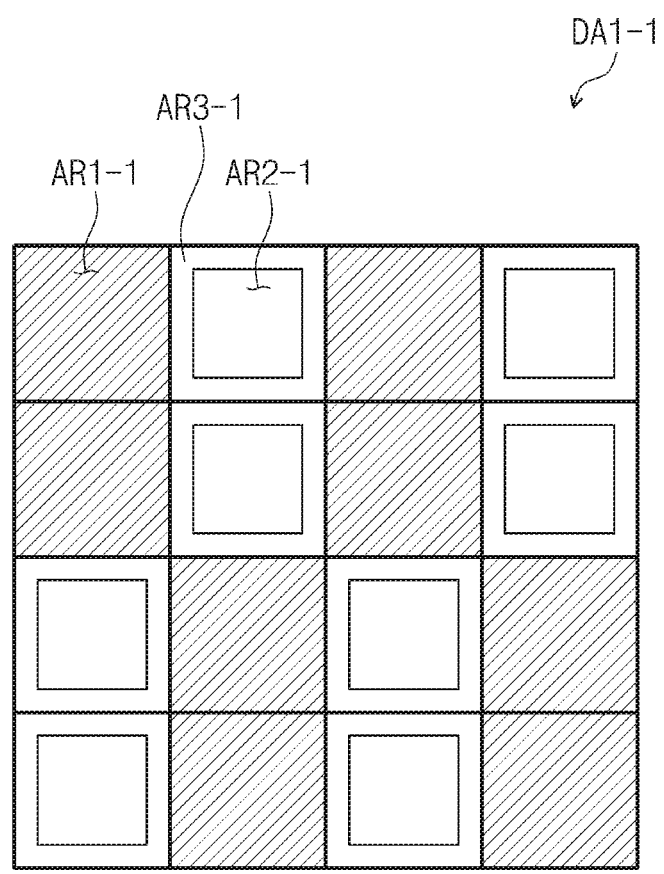
FIG. 9 is an enlarged plan view showing a portion of a first display area according to an embodiment of the present invention.
Figure 9:
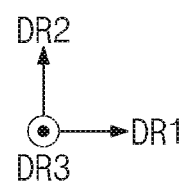

FIG. 9 is an enlarged plan view showing a portion of a first display area DA1-1 according to an embodiment of the present invention. In FIG. 9, the same reference numerals denote the same elements in FIG. 7, and thus, detailed descriptions of the same elements will be omitted.

Referring to FIG. 9, the first display area DA1-1 includes a plurality of first areas AR1-1, a plurality of second areas AR2-1, and a plurality of third areas AR3-1.

The plurality of first areas AR1-1 are disposed adjacent to each other. The plurality of second areas AR2-1 are disposed adjacent to each other. For example, two first areas AR1-1 among the plurality of first areas AR1-1 are disposed adjacent to each other in the second direction DR2. Two second areas AR2-1 among the plurality of second areas AR2-1 are disposed adjacent to each other in the second direction DR2. The two first areas AR1-1 disposed adjacent to each other in the second direction DR2 are alternately arranged in the first direction DR1 with the two second areas AR2-1 disposed adjacent to each other in the second direction DR2.

Figure 10:
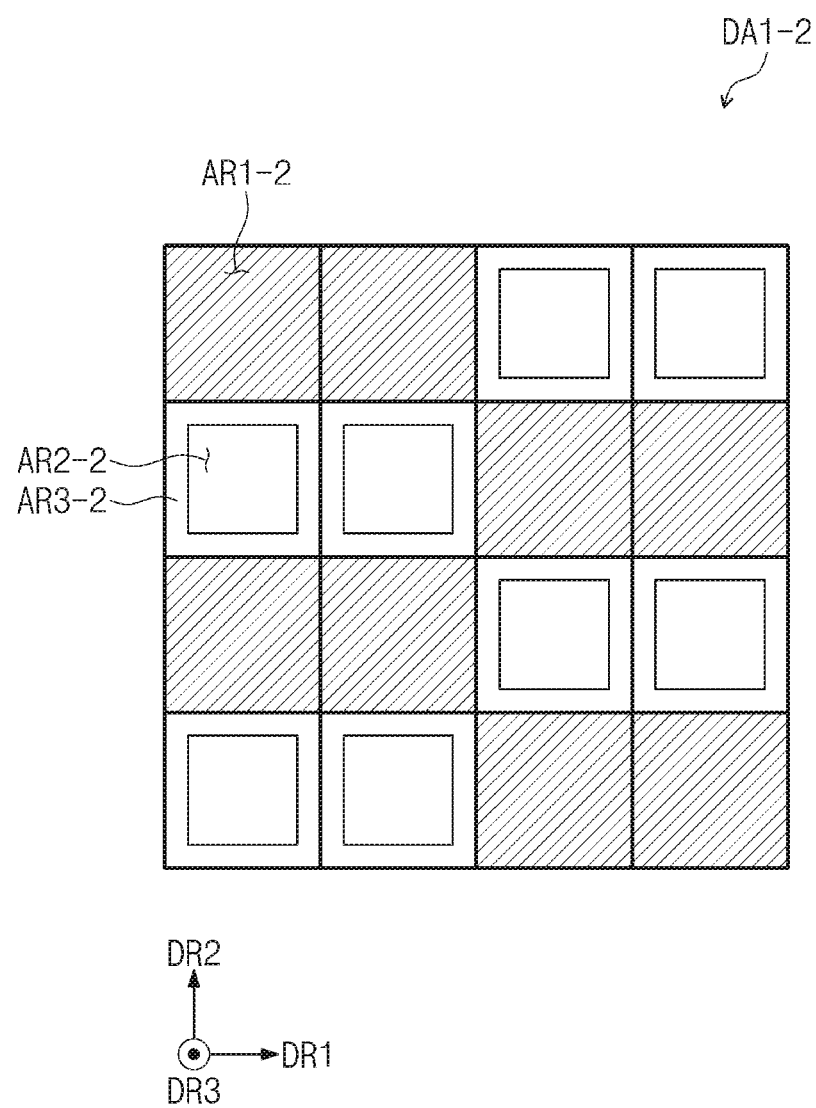
FIG. 10 is an enlarged plan view showing a portion of a first display area according to an embodiment of the present invention.

FIG. 10 is an enlarged plan view showing a portion of a first display area DA1-2 according to an embodiment of the present invention. In FIG. 10, the same reference numerals denote the same elements in FIG. 7, and thus, detailed descriptions of the same elements will be omitted.

Referring to FIG. 10, the first display area DA1-2 includes a plurality of first areas AR1-2, a plurality of second areas AR2-2, and a plurality of third areas AR3-2.

The plurality of first areas AR1-2 are disposed adjacent to each other. The plurality of second areas AR2-2 are disposed adjacent to each other. For example, two first areas AR1-2 among the plurality of first areas AR1-2 are disposed adjacent to each other in the first direction DR1. Two second areas AR2-2 among the plurality of second areas AR2-2 are disposed adjacent to each other in the first direction DR1. The two first areas AR1-2 disposed adjacent to each other in the first direction DR1 are alternately arranged in the second direction DR2 with the two second areas AR2-2 disposed adjacent to each other in the first direction DR1.

In an exemplary embodiment, each of a plurality of first areas and each of a plurality of second areas are alternately arranged in a first direction (e.g., in FIG. 7, the first direction DR1, in FIG. 9, the first direction DR1, and in FIG. 10, the second direction DR2). At least N of the plurality of first areas and at least N of the plurality of second areas are alternately arranged in a second direction (e.g., in FIG. 7, the second direction DR2, in FIG. 9, the second direction DR2, and in FIG. 10, the first direction DR1) different from the first direction. N is an integer number equal to or greater than one. For example, in FIG. 9, N is one and in FIGS. 9 and 10, N is two. In FIGS. 7, 9 and 10, a number of the plurality of first areas is equal to a number of the plurality of second areas.

Figure 11:
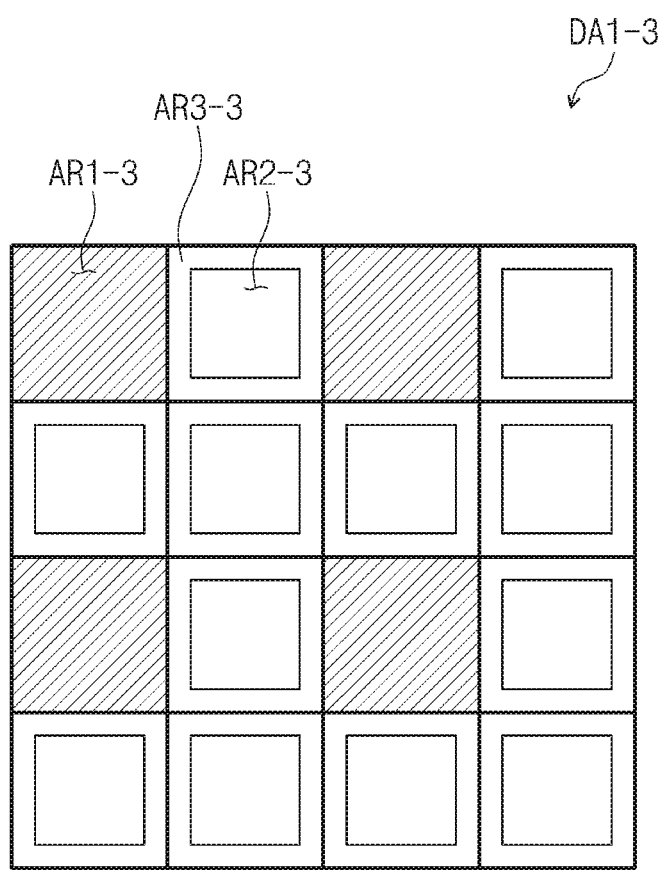
FIG. 11 is an enlarged plan view showing a portion of a first display area according to an embodiment of the present invention.
Figure 11:
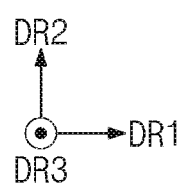

FIG. 11 is an enlarged plan view showing a portion of a first display area DA1-3 according to an embodiment of the present invention. In FIG. 11, the same reference numerals denote the same elements in FIG. 7, and thus, detailed descriptions of the same elements will be omitted.

Referring to FIG. 11, the first display area DA1-3 includes a plurality of first areas AR1-3, a plurality of second areas AR2-3, and a plurality of third areas AR3-3.

The number of the plurality of first areas AR1-3 is smaller than the number of the plurality of second areas AR2-3. For example, three second areas AR2-3 are configured per one first area AR1-3. Since the number of the plurality of second areas AR2-3 having the transmittance higher than the transmittance of the plurality of first areas AR1-3 is greater than the number of the plurality of first areas AR1-3, the first display area DA1-3 has the transmittance higher than the second display area DA2 (refer to FIG. 2).

Each of the plurality of first areas AR1-3 is spaced apart from another first area AR1-3 with one second area AR2-3 interposed therebetween. In an exemplary embodiment, a plurality of first areas AR1-3 are spaced apart from each other with each of the plurality of second areas AR2-3 interposed between a pair of first areas adjacent to each other of the plurality of first areas AR1-3. In this case, a number of the plurality of first areas AR1-3 is smaller than a number of the plurality of second areas AR2-3.

Figure 12:
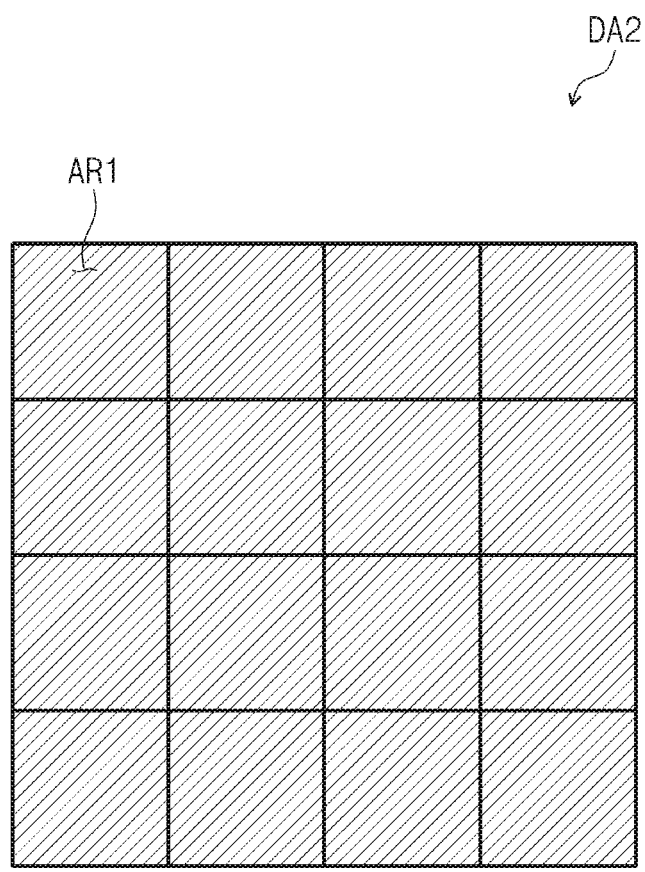
FIG. 12 is an enlarged plan view showing a portion of a second display area according to an embodiment of the present invention.

FIG. 12 is an enlarged plan view showing a portion of a second display area DA2 according to an embodiment of the present invention.

Referring to FIGS. 7 and 12, the second display area DA2 includes a plurality of first areas AR1. For example, the second display area DA2 may be an area defined by only the plurality of first areas AR1. The plurality of first areas AR1 are areas in which the plurality of pixels PX (refer to FIG. 5) are disposed. In an exemplary embodiment, the second display area DA2 has a pixel density (e.g., 16 pixels per a predetermined area such as a 4×4 pixel array) greater than a pixel density (e.g., 8 or 4 pixels per the predetermined area) of the first display area DA1.

The plurality of first areas AR1, the plurality of second areas AR2, and the plurality of third areas AR3 are arranged in the first display area DA1, and the plurality of first areas AR1 are arranged in the second display area DA2. The number of the plurality of first areas AR1 of the first display area DA1 is different from the number of the plurality of first areas AR1 of the second display area DA2 in the same area. For example, the number of the plurality of first areas AR1 of the first display area DA1 is smaller than the number of the plurality of first areas AR1 of the second display area DA2. Accordingly, the transmittance of the first display area DA1 is higher than the transmittance of the second display area DA2.

Figure 13A:
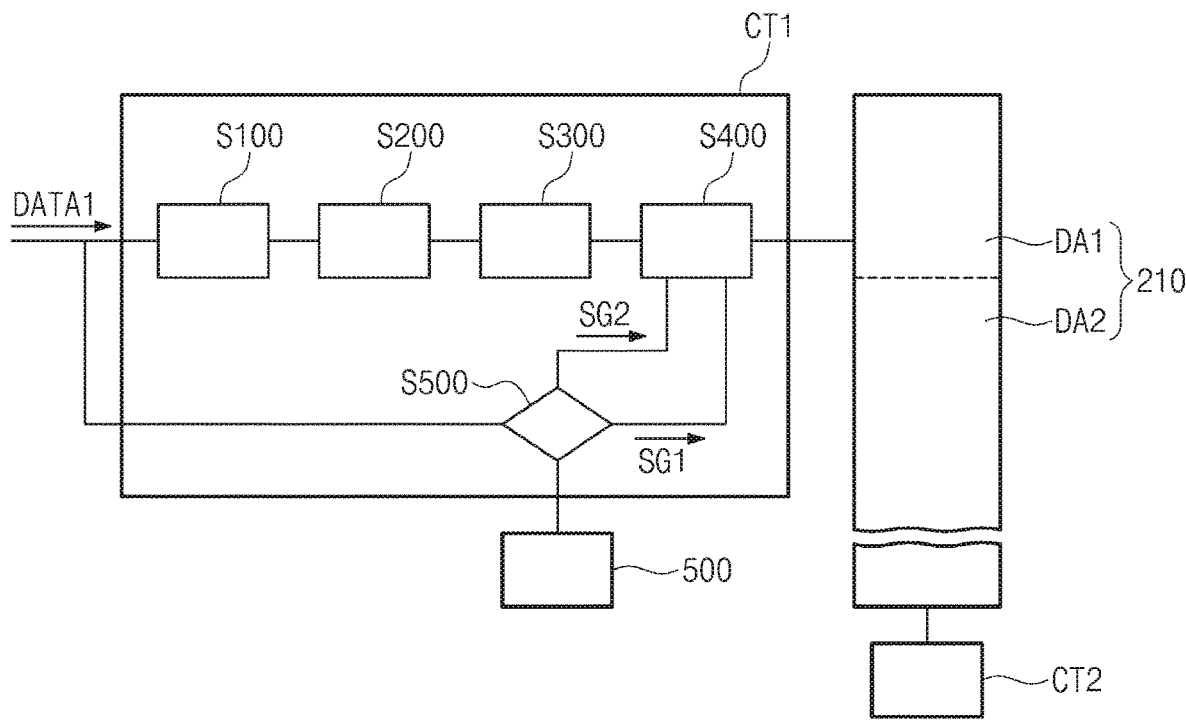
FIG. 13A is a block diagram showing a first controller, a second controller, and a display panel according to an embodiment of the present invention.
Figure 13B:
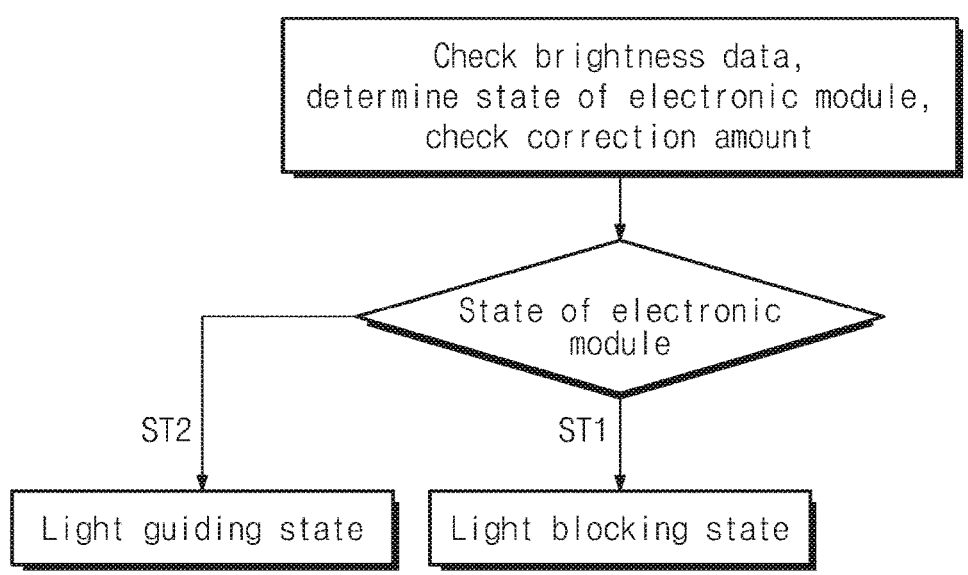
FIG. 13B is a flowchart showing an operation of a display device according to an embodiment of the present invention.

FIG. 13A is a block diagram showing a first controller, a second controller, and a display panel according to an embodiment of the present invention, and FIG. 13B is a flowchart showing an operation of a display device according to an embodiment of the present invention.

Referring to FIGS. 13A and 13B, the display device DD (refer to FIG. 1) includes a first controller CT1 and a second controller CT2, which are electrically connected to the display panel 210.

The first controller CT1 is electrically connected to the first display area DA1. The first controller CT1 includes a brightness difference calculator circuit S100, a storage S200, a correction amount determiner circuit S300, a corrector circuit S400, and a state determiner circuit S500. The first controller CT1 receives brightness data DATA1 from the outside. The brightness data DATA1 include cumulative brightness data of the first display area DA1. The brightness data DATA1 are provided to the brightness difference calculator circuit S100 and the state determiner circuit S500.

The brightness difference calculator circuit S100 receives the brightness data DATA1 and compares a first brightness of the first display area DA1 with a second brightness of the second display area DA2 to calculate a difference between the first brightness and the second brightness. The brightness difference calculator circuit S100 calculates information about brightness reduction amount using the difference.

The storage S200 receives and stores the information about brightness reduction amount from the brightness difference calculator circuit S100.

The correction amount determiner circuit S300 determines a correction amount to correct insufficient brightness in the first display area DA1 based on the information about the brightness reduction amount stored in the storage S200.

The state determiner circuit S500 is connected to the electronic module 500. The state determiner circuit S500 receives the brightness data DATA1. The state determiner circuit S500 determines an operation state of the electronic module 500 and provides a signal to the corrector circuit S400. The signal includes information SG1 indicating that the electronic module 500 operates or includes information SG2 indicating that the electronic module 500 does not operate.

The corrector circuit S400 is connected to the correction amount determiner circuit S300 and the state determiner circuit S500. The corrector circuit S400 receives correction amount information from the correction amount determiner circuit S300. The corrector circuit S400 receives the signal from the state determiner circuit S500. The corrector circuit S400 controls the first brightness. For example, the corrector circuit S400 controls the plurality of pixels PX (refer to FIG. 5) arranged in the first display area DA1 based on the correction amount information such that the first brightness has a value similar to that of the second brightness.

The display device DD (refer to FIG. 1) checks the brightness data DATA1, the state of the electronic module 500, and the correction amount information and is controlled in a first state ST1 that is a light blocking state or a second state ST2 that is a light guiding state depending on the state of the electronic module 500.

The first state ST1 corresponds to the state in which the electronic module 500 operates. The state determiner circuit S500 provides the information SG1 indicating that the electronic module 500 operates to the corrector circuit S400, and the corrector circuit S400 controls the display device DD (refer to FIG. 1) in the first state ST1.

The second state ST2 corresponds to the state in which the electronic module 500 does not operate. The state determiner circuit S500 provides the information SG2 indicating that the electronic module 500 does not operate to the corrector circuit S400, and the corrector circuit S400 controls the display device DD (refer to FIG. 1) in the second state ST2.

The second controller CT2 is electrically connected to the second display area DA2. The second controller CT2 provides a signal to drive the display panel 210.

Meanwhile, although not shown in figures, the first controller CT1 and the second controller CT2 are connected to the main circuit board MB (refer to FIG. 2), however, this is merely exemplary. The first controller CT1 and the second controller CT2 according to an embodiment of the present invention may be connected to different main circuit boards from each other, and one of the first controller CT1 and the second controller CT2 may not be connected to the main circuit board, however, they should not be particularly limited.

Figure 14:
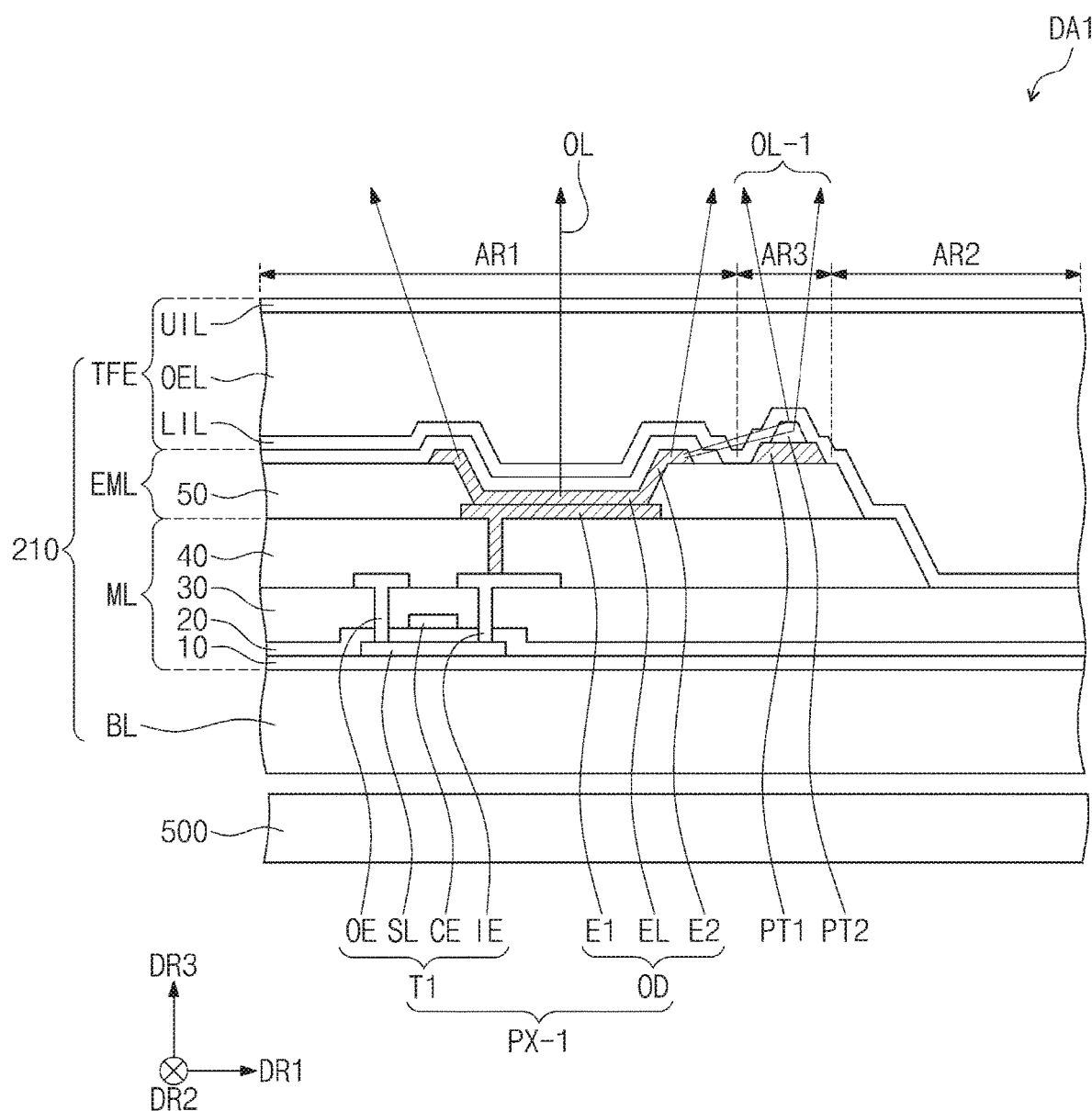
FIG. 14 is a cross-sectional view showing a portion of a first display area according to an embodiment of the present invention.

FIG. 14 is a cross-sectional view showing a portion of a first display area according to an embodiment of the present invention. In FIG. 14, the same reference numerals denote the same elements in FIG. 8, and thus, detailed descriptions of the same elements will be omitted.

Referring to FIGS. 13A, 13B, and 14, the electronic module 500 is disposed under the first display area DA1. The electronic module 500 overlaps the first area AR1, the second area AR2, and the third area AR3 in a plan view. In the embodiment of the present invention, the electronic module 500 may include a camera.

When the electronic module 500 does not operate, the state determiner circuit S500 transmits a signal including the information SG2 indicating that the electronic module 500 does not operate to the corrector circuit S400. The corrector circuit S400 controls the display device DD (refer to FIG. 1) in the second state ST2. The corrector circuit S400 outputs a signal to turn on an adjacent pixel PX-1 adjacent to the third area AR3 among the plurality of pixels PX (refer to FIG. 5).

The light emitting pattern EL of the adjacent pixel PX-1 emits a light OL. A portion of the light OL emitted from the adjacent pixel PX-1 is provided to the second pattern layer PT2. The second pattern layer PT2 controls a traveling direction of the light OL and provides a first light OL-1. For example, the second pattern layer PT2 provides the first light OL-1 to the third direction DR3. The first area AR1 and the third area AR3 provide the light to the outside. Compared to if the first display area DA1 does not include the second pattern layer PT2, the light emitting pattern EL has increased brightness.

According to the present invention, the second pattern layer PT2 controls the traveling direction of the light OL provided from the adjacent pixel PX-1 and provides the first light OL-1 to the outside. The third area AR3 provides the first light OL-1 to the outside. The first light OL-1 provided from the third area AR3 compensates for the insufficient brightness in the first display area DA1. The first brightness of the first display area DA1 has a value similar to the second brightness of the second display area DA2 (refer to FIG. 5), and a visibility of the display device DD (refer to FIG. 2) is increased. Accordingly, the display device DD (refer to FIG. 2) having increased reliability is provided.

Figure 15:
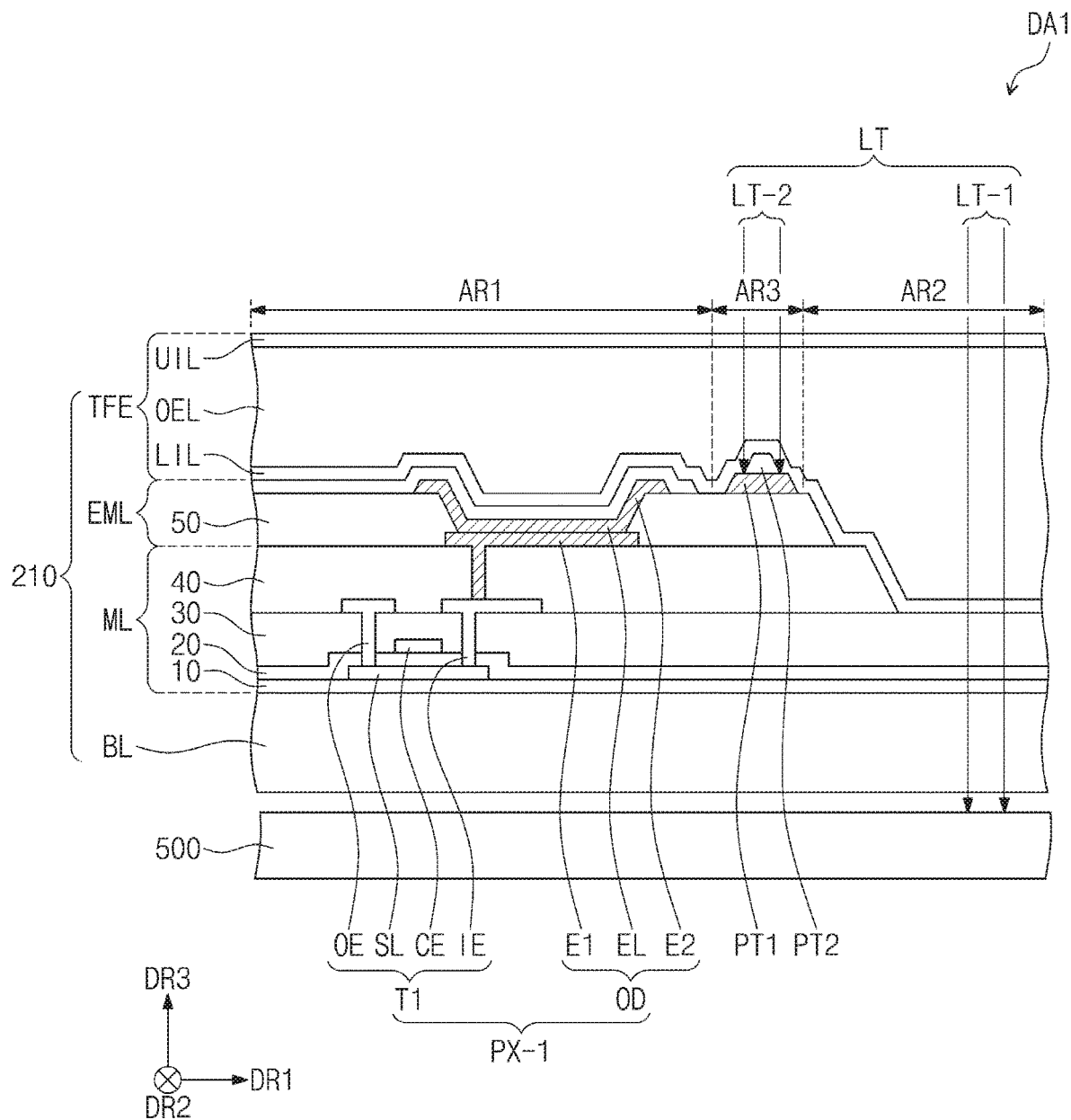
FIG. 15 is a cross-sectional view showing a portion of a first display area according to an embodiment of the present invention.

FIG. 15 is a cross-sectional view showing a portion of a first display area according to an embodiment of the present invention. In FIG. 15, the same reference numerals denote the same elements in FIGS. 8 and 14, and thus, detailed descriptions of the same elements will be omitted.

Referring to FIGS. 13A, 13B, 14, and 15, the electronic module 500 photographs a light LT incident thereto from the outside to form an image. The light LT includes a first light LT-1 and a second light LT-2. The first light LT-1 transmits through the display panel 210 toward the electronic module 500 in the second area AR2. The second light LT-2 is provided between the first area AR1 and the second area AR2. For example, the second light LT-2 is provided to the third area AR3.

When the electronic module 500 operates, the state determiner circuit S500 transmits the signal including the information SG1 indicating that the electronic module 500 operates to the corrector circuit S400. The corrector circuit S400 controls the display device DD (refer to FIG. 1) in the first state ST1. The corrector circuit S400 outputs a signal to turn off the adjacent pixel PX-1 adjacent to the third area AR3 among the pixels PX. The turned-off adjacent pixel PX-1 prevents the image photographed by the electronic module 500 from being influenced by the light OL.

The second light LT-2 may be diffracted, refracted, or reflected by a step difference between the first area AR1 and the second area AR2, and thus, the image may be distorted. However, according to the present invention, the first pattern layer PT1 blocks the second light LT-2. Since the first pattern layer PT1 blocks the second light LT-2, the image is prevented from being distorted. The electronic module 500 photographs the first light LT-1 and forms the image. The first pattern layer PT1 improves a quality of the image. Accordingly, the display device DD (refer to FIG. 2) having the increased reliability is provided.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the disclosed subject matter should not be limited to any single embodiment described herein, and the scope of the present inventive concept shall be determined according to the attached claims.

What is claimed is:

1. A display device comprising:
   a display panel comprising a first display area and a second display area having a transmittance lower than the first display area; and
   an electronic module disposed under the first display area,
   wherein the display panel comprises a plurality of first areas, a plurality of second areas, and a plurality of third areas arranged in the first display area,
   wherein each of the plurality of third areas surrounds a corresponding one of the plurality of second areas,
   wherein the plurality of second areas have a transmittance higher than the plurality of first areas,
   wherein the plurality of first areas include a plurality of pixels, and
   wherein each of the plurality of first areas is disposed between a corresponding two second areas, spaced apart from each other in a first direction, among the plurality of second areas and disposed between a corresponding two second areas, spaced apart from each other in a second direction different from the first direction, among the plurality of second areas.

2. The display device of claim 1,
wherein the display panel further comprises a circuit layer disposed in the plurality of first areas, the plurality of second areas, and the plurality of third areas, and
wherein each of the plurality of second areas is provided with a transmission opening defined therein by removing a portion of the circuit layer.

3. The display device of claim 1,
wherein the display panel further comprises a plurality of first pattern layers surrounding the plurality of second areas, respectively, and a plurality of second pattern layers stacked on the plurality of first pattern layers, respectively, and
wherein each of a plurality of pairs of one of the plurality of first pattern layers and one of the plurality of second patterns layers stacked on each other is disposed in a corresponding one of the plurality of third areas.

4. The display device of claim 3,
wherein each of the plurality of pixels comprises a light emitting layer, and
wherein the plurality of second pattern layers are configured to control a traveling direction of a light emitted from the light emitting layer.

5. The display device of claim 4,
wherein the plurality of first pattern layers are configured to block a light incident thereto from an outside of the display panel.

6. The display device of claim 1,
wherein the electronic module overlaps the plurality of first areas, the plurality of second areas, and the plurality of third areas in a plan view.

7. A display device comprising:
a display panel comprising a first display area and a second display area having a transmittance lower than the first display area; and
an electronic module disposed under the first display area,
wherein the display panel comprises a plurality of first areas, a plurality of second areas, and a plurality of third areas arranged in the first display area,
wherein each of the plurality of third areas surrounds a corresponding one of the plurality of second areas,
wherein the plurality of second areas have a transmittance higher than the plurality of first areas,
wherein the plurality of first areas includes a plurality of pixels,
wherein at least one of the plurality of first areas and at least one of the plurality of second areas are alternately arranged in a first direction or a second direction different from the first direction.

8. The display device of claim 7,
wherein the display panel further comprises a plurality of first pattern layers surrounding the plurality of second areas, respectively, and a plurality of second pattern layers stacked on the plurality of first pattern layers, respectively, and
wherein each of a plurality of pairs of one of the plurality of first pattern layers and one of the plurality of second patterns layers stacked on each other is disposed in a corresponding one of the plurality of third areas.

9. The display device of claim 8,
wherein each of the plurality of pixels comprises a light emitting layer, and
wherein the plurality of second pattern layers are configured to control a traveling direction of a light emitted from the light emitting layer.

10. The display device of claim 9,
wherein the plurality of first pattern layers are configured to block a light incident thereto from an outside of the display panel.

11. The display device of claim 7,
wherein the electronic module overlaps the plurality of first areas, the plurality of second areas, and the plurality of third areas in a plan view.

12. A display device comprising:
a display panel comprising a first display area and a second display area having a transmittance lower than the first display area; and
an electronic module disposed under the first display area,
wherein the display panel comprises a first area, a plurality of second areas, and a plurality of third areas arranged in the first display area,
wherein each of the plurality of third areas surrounds a corresponding one of the plurality of second areas,
wherein the plurality of second areas have a transmittance higher than the first area, wherein the first area is surrounded by the plurality of second areas and includes a plurality of pixels.

13. The display device of claim 12,
wherein the display panel further comprises a plurality of first pattern layers surrounding the plurality of second areas, respectively, and a plurality of second pattern layers stacked on the plurality of first pattern layers, respectively, and
wherein each of a plurality of pairs of one of the plurality of first pattern layers and one of the plurality of second patterns layers stacked on each other is disposed in a corresponding one of the plurality of third areas.

14. The display device of claim 13,
wherein each of the plurality of pixels comprises a light emitting layer, and
wherein the plurality of second pattern layers are configured to control a traveling direction of a light emitted from the light emitting layer.

15. The display device of claim 14,
wherein the plurality of first pattern layers are configured to block a light incident thereto from an outside of the display panel.

16. The display device of claim 12,
wherein the electronic module overlaps the first area, the plurality of second areas, and the plurality of third areas in a plan view.

* * * * *